United States Patent
Kobashi et al.

(10) Patent No.: US 11,289,667 B2
(45) Date of Patent: Mar. 29, 2022

(54) LIGHT-EMITTING DEVICE WITH HIGH ELECTRON INJECTION EFFICIENCY

(71) Applicant: SHARP KABUSHIKI KAISHA, Sakai (JP)

(72) Inventors: Tadashi Kobashi, Sakai (JP); Yoshihiro Ueta, Sakai (JP); Makoto Izumi, Sakai (JP); Noboru Iwata, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/968,543

(22) PCT Filed: Feb. 13, 2018

(86) PCT No.: PCT/JP2018/004808
§ 371 (c)(1),
(2) Date: Aug. 7, 2020

(87) PCT Pub. No.: WO2019/159216
PCT Pub. Date: Aug. 22, 2019

(65) Prior Publication Data
US 2021/0050543 A1  Feb. 18, 2021

(51) Int. Cl.
*H01L 29/08* (2006.01)
*H01L 51/50* (2006.01)
*H01L 51/56* (2006.01)

(52) U.S. Cl.
CPC .......... *H01L 51/5012* (2013.01); *H01L 51/56* (2013.01)

(58) Field of Classification Search
CPC .......................... H01L 51/5012; H01L 51/56
See application file for complete search history.

(56) References Cited

U.S. PATENT DOCUMENTS

| | | | |
|---|---|---|---|
| 9,768,404 B1* | 9/2017 | Steckel | H01L 51/506 |
| 2007/0103068 A1 | 5/2007 | Bawendi et al. | |
| 2009/0045725 A1* | 2/2009 | Fukushima | H01L 51/0035 313/504 |
| 2010/0096617 A1* | 4/2010 | Shanks | H01L 51/5271 257/13 |
| 2011/0036971 A1* | 2/2011 | Ho | H01L 51/426 250/214.1 |
| 2011/0079273 A1* | 4/2011 | Arango | H01L 51/4273 136/252 |
| 2012/0234372 A1* | 9/2012 | Takayama | H01L 27/301 136/246 |
| 2012/0238047 A1 | 9/2012 | Bawendi et al. | |

(Continued)

FOREIGN PATENT DOCUMENTS

| | | |
|---|---|---|
| JP | 2012-023388 A | 2/2012 |
| WO | 2006/088877 A1 | 8/2006 |

*Primary Examiner* — Caleb E Henry
(74) *Attorney, Agent, or Firm* — ScienBiziP, P.C.

(57) ABSTRACT

The light-emitting device includes, between an anode electrode and a cathode electrode, a light-emitting layer, a hole transport layer, and an electron transport layer. The light-emitting layer includes quantum dots configured to emit light as a result of combination of positive holes and electrons. The electron transport layer includes a metal oxide, and an energy level of a lower end of a conduction band of the metal oxide is less than or equal to an energy level of a lower end of a conduction band of the quantum dots.

15 Claims, 3 Drawing Sheets

(56) References Cited

U.S. PATENT DOCUMENTS

| | | | |
|---|---|---|---|
| 2012/0292595 A1 | 11/2012 | Bawendi et al. | |
| 2013/0063023 A1* | 3/2013 | Pan | C09K 11/06 |
| | | | 313/504 |
| 2013/0200360 A1* | 8/2013 | Oikawa | H01L 51/0085 |
| | | | 257/40 |
| 2016/0276413 A1* | 9/2016 | Iida | H01L 31/048 |
| 2017/0125635 A1 | 5/2017 | Bawendi et al. | |
| 2018/0019371 A1* | 1/2018 | Steckel | H01L 27/156 |
| 2019/0081260 A1* | 3/2019 | Xu | H01L 51/5056 |

* cited by examiner

LIGHT-EMITTING DEVICE WITH HIGH ELECTRON INJECTION EFFICIENCY

TECHNICAL FIELD

The present invention relates to a light-emitting device using Quantum Dots (QDs).

BACKGROUND ART

In recent years, for example, as a light source of a display device, a light-emitting device including QD dots (also referred to as quantum dot particles, semiconductor nanoparticles, and QD dopants) has been used. PTL 1 discloses an example of such a light-emitting device. The light-emitting device in PTL 1 includes a first charge transport layer containing a first inorganic material in contact with a first electrode disposed such that charges are introduced into the first charge transport layer, a second electrode, and a plurality of semiconductor nanocrystals disposed between the first electrode and the second electrode.

CITATION LIST

Patent Literature

PTL 1: JP 2012-23388 A

SUMMARY OF INVENTION

Technical Problem

The technique of PTL 1 has, however, the problem that the efficiency of injecting electrons into semiconductor nanocrystals (quantum dots) is low.

One aspect of the present invention has an object to achieve a light-emitting device having high efficiency of injecting electrons into the quantum dots.

Solution to Problem

To solve the above problem, a light-emitting device according to one aspect of the present invention includes, between an anode electrode and a cathode electrode, a light-emitting layer, a hole transport layer configured to transport positive holes supplied from the anode electrode to the light-emitting layer, and an electron transport layer configured to transport electrons supplied from the cathode electrode to the light-emitting layer, wherein the light-emitting layer includes quantum dots configured to emit light as a result of a combination of the positive holes and the electrons, the electron transport layer includes a metal oxide, and an energy level of a lower end of a conduction band of the metal oxide is less than or equal to an energy level of a lower end of a conduction band of the quantum dots.

Advantageous Effects of Invention

According to the light-emitting device according to one aspect of the present invention, a light-emitting device having high luminous efficiency can be provided.

DESCRIPTION OF EMBODIMENTS

First Embodiment

Hereinafter, a first embodiment of the present invention will be described in detail with reference to drawings. In the following, a "same layer" refers to a layer formed in the same process using the same material, a "lower layer" refers to a layer formed in a process before a process in which a layer to be compared is formed, and an "upper layer" refers to a layer formed in a process after the process in which the layer to be compared is formed. Further, note that each drawing schematically describes the shape, structure, and positional relationship of each member, and is not necessarily drawn to scale.

Figure 1:
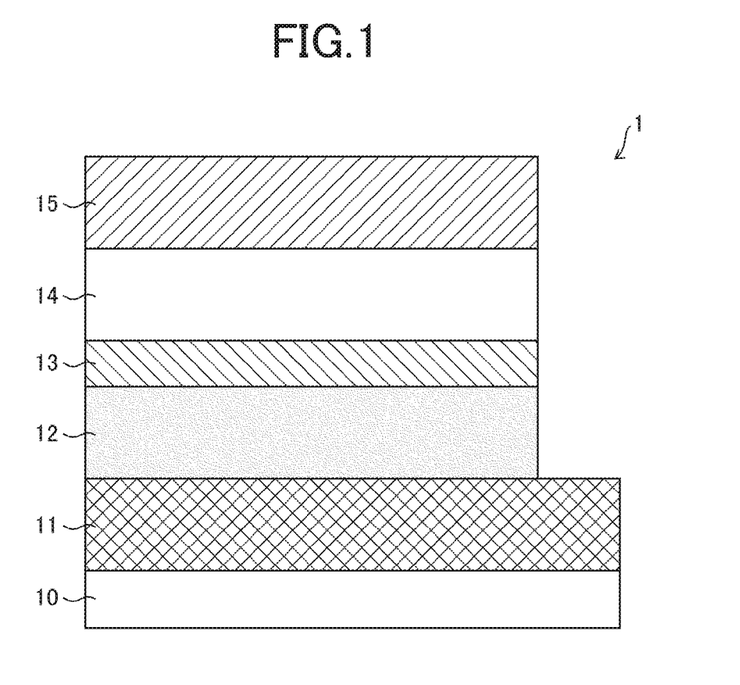
FIG. 1 is a diagram illustrating a schematic configuration of a light-emitting device according to a first embodiment.

FIG. 1 is a diagram illustrating a schematic configuration of a light-emitting device 1 of the first embodiment. The light-emitting device 1 is used as a light source of a display device (not illustrated). That is, the display device includes the light-emitting device 1 as the light source. Of the members included in the light-emitting device 1, the description of members not related to the first embodiment will be omitted. It may be understood that the members descriptions of which are omitted are similar to those known in the art.

Configuration of Light-Emitting Device 1

The light-emitting device 1 is a light source configured to cause each pixel (red pixel (R pixel), green pixel (G pixel), and blue pixel (B pixel)) of the above-described display device to light up. In the first embodiment, the above-described display device expresses an image with a plurality of pixels of RGB (Red, Green, Blue).

The light-emitting device 1 includes quantum dots (QD phosphor particles) which emit light as a result of a combination of positive holes supplied from an anode electrode 11 (anode) and electrons (free electrons) supplied from a cathode electrode 15 (cathode). More specifically, the quantum dots are included in a light-emitting layer 13 (QD phosphor layer) provided between the anode electrode 11 and the cathode electrode 15. Hereinafter, a direction from the anode electrode 11 to the cathode electrode 15 is referred to as an upward direction. A direction opposite to the upward direction is referred to as a downward direction.

As illustrated in FIG. 1, the light-emitting device 1 includes a substrate 10, the anode electrode 11, a hole transport layer (HTL) 12, the light-emitting layer 13, an electron transport layer (ETL) 14, and the cathode electrode 15 in this order from the bottom side of FIG. 1 toward the upward direction.

The components between the anode electrode 11 and the cathode electrode 15 are supported by the substrate 10 provided below the anode electrode 11. As an example, when manufacturing the light-emitting device 1, the anode electrode 11, the hole transport layer 12, the light-emitting layer 13, the electron transport layer 14, and the cathode electrode 15 are formed (film formation) on the substrate 10 in this order.

The substrate 10 is configured by a substrate having high transparency (e.g., a glass substrate). In the present embodiment, the light-emitting device 1 is described as a light-emitting device having a bottom-emitting configuration in which light emitted from the light-emitting layer 13 is emitted downward. Note that in a case where the light-emitting device 1 is a light-emitting device having a top-emitting configuration in which light emitted from the light-emitting layer 13 is emitted upward, the substrate 10 may be a substrate having low transparency (e.g., a plastic substrate).

The anode electrode 11 is preferably formed of a material having a relatively large work function, such as tin doped indium oxide (ITO), zinc doped indium oxide (IZO), aluminum doped zinc oxide (AZO), gallium doped zinc oxide (GZO), and antimony doped tin oxide (ATO). Sputtering, film evaporation, vacuum vapor deposition, physical vapor deposition (PVD), or the like is used for the film formation of the anode electrode 11. The anode electrode 11 is transparent so that light emitted from the light-emitting layer 13 can be transmitted.

The hole transport layer 12 is a layer that transports positive holes supplied from the anode electrode 11 to the light-emitting layer 13. The hole transport layer 12 includes a material with excellent hole transport properties. The material may be an organic material or an inorganic material. In a case where the material is the inorganic material, it may be a semiconductor such as a metal oxide and a metal sulfide, and for example, NiO or the like can be used. The hole transport layer 12 may be a single layer or a layered layer. Sputtering, vacuum vapor deposition, physical vapor deposition, spin coating, an ink-jet method, or the like can be used for film formation of the hole transport layer 12.

The light-emitting layer 13 includes the quantum dots that emit light as a result of a combination of positive holes supplied from the anode electrode 11 and electrons supplied from the cathode electrode 15. As an example, a material of the quantum dots may be at least one material selected from the group consisting of GaN, GaP, $Ga_2O_3$, $Ga_2S_3$, Ge, CdSe, CdS, CdTe, CdO, InP, InN, $InS_3$, InGaN, AlInN, AlGaInN, and CuInGaSe. More specifically, nano-sized crystals of the above-described materials are used as the material of the QD phosphor particles.

Note that the quantum dots may have a core-shell configuration in which the outer periphery is covered by a material having a different band gap from that of the material constituting the quantum dots. With the core-shell configuration, quantum efficiency can be improved. The quantum dots preferably have a modifying group (ligand) on a surface layer. As a result, dispersibility of the quantum dots can be improved.

A technique such as spin coating, an ink-jet method, photolithography, or the like can be preferably used for film formation of the light-emitting layer 13.

The electron transport layer 14 is a layer that transports electrons supplied from the cathode electrode 15 to the light-emitting layer 13. The electron transport layer 14 includes a metal oxide in which an energy level of the lower end of a conduction band (the lowest unoccupied molecular orbital (LUMO)) is less than or equal to an energy level of the lower end of a conduction band of the quantum dots included in the light-emitting layer 13.

In the present embodiment, the electron transport layer 14 includes a metal oxide including In, Ga, and Zn as the metal oxide. More specifically, a composition ratio of In, Ga, and Zn in the metal oxide is In:Ga:Zn=1:X:Y (0.8≤X≤1.2 and 0.4≤Y≤1.2). For example, the metal oxide has a stoichiometric ratio of In:Ga:Zn:O=1:1:1:4 and In:Ga:Zn:O=2:2:1:7, and the loss of oxygen from the stoichiometric ratio changes the carrier mobility. It is not necessary to be the stoichiometric ratio described above, and the composition may vary linearly between In:Ga:Zn:O=1:1:1:4 and In:Ga:Zn:O=2:2:1:7.

The metal oxide can be formed by sputtering. The composition ratio of In, Ga, Zn, and O can be controlled by changing an oxygen concentration of a sputter gas when forming the metal oxide. The composition ratio of the metal oxide can therefore be controlled such that the amount of electrons transported to the light-emitting layer 13 is appropriate by controlling the oxygen concentration of the sputter gas in consideration of a carrier density of the hole transport layer 12.

The ligand that modifies the quantum dots included in the light-emitting layer 13 is susceptible to damage by heat or oxygen plasma. There is therefore a problem in that a film formation state of the light-emitting layer is deteriorated when the electron transport layer 14 is formed on the upper portion of the light-emitting layer 13. In contrast, according to the present embodiment, the metal oxide including In, Ga, and Zn can be formed by sputtering at room temperature. As a result, compared to high-frequency sputtering, damage imparted during sputtering to the ligand that modifies the quantum dots included in the light-emitting layer 13 can be reduced.

In a case where the energy level of the lower end of the conduction band of the metal oxide included in the electron transport layer is greater than the energy level of the lower end of the conduction band of the quantum dots included in the light-emitting layer 13 as in the conventional light-emitting device, bending of the band structure (triangular potential) is generated by hetero-bonding between the metal oxide and the quantum dots. As a result, there is a region where the current density change exhibits the negative differential resistance with respect to the increase in voltage, so that the efficiency of injecting electrons from the electron transport layer into the quantum dots is low. There is therefore a problem in that the voltage needs to be increased in order to inject electrons from the electron transport layer into the quantum dots.

In contrast, in the metal oxide according to the present embodiment, as described above, the energy level of the lower end of the conduction band is less than or equal to the energy level of the lower end of the conduction band of the quantum dots. This can reduce the influence of the triangular potential generated by the hetero-bonding between the metal oxide and the quantum dots. As a result, electrons can be efficiently injected from the electron transport layer 14 into the quantum dots. Thus, electrons can be injected from the electron transport layer 14 into the quantum dots at a low voltage.

The carrier density of the metal oxide included in the electron transport layer 14 is preferably $1.0 \times 10^{17}$ $cm^{-3}$ or greater. In a case where the carrier density of the metal oxide is less than $1.0 \times 10^{17}$ $cm^{-3}$, the triangular potential of the band generated by the hetero-bonding is large, and the region where the current density change exhibits the negative differential resistance with respect to the voltage application tends to be present. As a result, the efficiency of injecting of electrons from the electron transport layer 14 into the quantum dots is reduced. This is a reason why such a carrier density is preferable. Note that the carrier density of the metal oxide included in the electron transport layer 14 is more preferably $1.0 \times 10^{19}$ cm$^{-3}$ or greater.

As described above, in the metal oxide including In, Ga, and Zn, a composition ratio of In, Ga, Zn, and O can be controlled when forming the metal oxide by sputtering. The carrier density can be therefore easily controlled in the metal oxide including In, Ga, and Zn. As a result, in the metal oxide including In, Ga, and Zn, the difference between the energy level of the lower end of the conduction band and the Fermi level can be reduced. As a result, the triangular potential generated when hetero-junction is established can be reduced, and electrons can be efficiently injected from the electron transport layer 14 into the quantum dots.

Note that in the light-emitting device according to one aspect of the present invention, the carrier density of the metal oxide included in the electron transport layer may be $1.0 \times 10^{20}$ cm$^{-3}$, so that the Fermi level may be located in the conduction band to degenerate.

In the metal oxide including In, Ga, and Zn according to the present invention, the difference between the energy level of the lower end of the conduction band thereof and the energy level of the lower end of the conduction band of the quantum dots included in the light-emitting layer 13 is preferably less than 0.5 eV. This is because in a case where the difference between the energy level of the lower end of the conduction band of the metal oxide and the energy level of the lower end of the conduction band of the quantum dots is greater than or equal to 0.5 eV, the applied voltage required when injecting electrons into the quantum dots is large, and the drive voltage of the light-emitting device increases. Note that in the metal oxide including In, Ga, and Zn according to the present invention, the difference between the energy level of the lower end of the conduction band thereof and the energy level of the lower end of the conduction band of the quantum dots is preferably less than 0.4 eV.

In the light-emitting device according to the present embodiment, the metal oxide including In, Ga, and Zn may be crystalline or amorphous. In a case where the metal oxide is crystalline, the carrier mobility of the electron transport layer 14 can be improved. In a case where the metal oxide is amorphous, a grain boundary is not present, and an interface between the electron transport layer 14 and the light-emitting layer 13 is flat. This allows electrons to be effectively injected.

Note that in the light-emitting device 1 of one aspect of the present invention, the metal oxide included in the electron transport layer 14 is not limited to a metal oxide including In, Ga, and Zn, and another metal oxide may be used as long as the energy level of the lower end of the conduction band of the metal oxide is less than or equal to the energy level of the lower end of the conduction band of the quantum dots included in the light-emitting layer 13. For example, $TiO_2$ or the like can be used as the metal oxide.

A film thickness of the electron transport layer 14 is preferably is 5 nm or greater and 200 nm or less. In a case where the film thickness of the electron transport layer 14 is less than 5 nm, electrons cannot be sufficiently injected into the light-emitting layer 13. In a case where the film thickness of the electron transport layer 14 is greater than 200 nm, the electron transport layer 14 serves as a resistant, making it difficult to inject electrons into the light-emitting layer 13.

The cathode electrode 15 is preferably formed of a material having a relatively low work function, such as Al, Ag, Ba, Yb, Ca, Li—Al alloy, Mg—Al alloy, Mg—Ag alloy, Mg—In alloy, and Al—Al$_2$O$_3$ alloy. Sputtering, film evaporation, vacuum vapor deposition, physical vapor deposition, and the like are used for film formation of the cathode electrode 15. The cathode electrode 15 is a reflective electrode that reflects the light emitted from the light-emitting layer 13.

In the light-emitting device 1, by applying a forward voltage between the anode electrode 11 and the cathode electrode 15 (by setting the anode electrode 11 to a potential higher than that of the cathode electrode 15), (i) electrons can be supplied from the cathode electrode 15 to the light-emitting layer 13 and (ii) positive holes can be supplied from the anode electrode 11 to the light-emitting layer 13. As a result, in the light-emitting layer 13, light can be generated as a result of a combination of positive holes and electrons. The above-described application of the voltage may be controlled by a Thin Film Transistor (TFT) (not illustrated).

As described above, the light-emitting device 1 according to the present embodiment is a light-emitting device including, between the anode electrode 11 and the cathode electrode 15, the light-emitting layer 13 including quantum dots that emit light as a result of the combination of the positive holes and the electrons, the hole transport layer 12, and the electron transport layer 14. The electron transport layer 14 includes the metal oxide whose energy level of the lower end of the conduction band is less than or equal to the energy level of the lower end of the conduction band of the quantum dots.

The configuration described above can reduce the influence of the triangular potential generated by hetero-bonding between the metal oxide included in the electron transport layer 14 and the quantum dots included in the light-emitting layer 13. As a result, electrons can be efficiently injected from the electron transport layer 14 into the quantum dots. Thus, electrons can be injected from the electron transport layer 14 into the quantum dots at a low voltage.

Note that the light-emitting device 1 of one aspect of the present invention may include a hole blocking layer ((HBL) that suppresses the injection of the positive holes into the light-emitting layer 13. Accordingly, the balance of the carriers (i.e., positive holes and electrons) supplied to the light-emitting layer 13 can be adjusted.

In addition, the light-emitting device 1 of one aspect of the present invention may include an electron blocking layer (EBL) that suppresses the injection of electrons into the light-emitting layer 13. Accordingly, the balance of the carriers (i.e., positive holes and electrons) supplied to the light-emitting layer 13 can be adjusted.

The light-emitting device 1 of one aspect of the present invention is preferably sealed after completion of film formation up to the cathode electrode 15. A member for sealing the light-emitting device (sealing member) may be formed of glass, plastic, or the like, and preferably has a recessed shape. Specifically, a sealing adhesive (for example, an epoxy-based adhesive) is applied between the above-described sealing member and the substrate 10, and sealing is performed under nitrogen atmosphere.

In the light-emitting device 1 of one aspect of the present invention, a film of the electron transport layer 14 may be formed for each unit of a plurality of pixels and may be formed in common for the plurality of pixels, provided that each of the red pixels (R pixels), green pixels (G pixels), and blue pixels (B pixels) can be individually caused to light up.

Modification Example 1

The light-emitting device 1 may be configured as a top-emitting type light-emitting device. In other words, the light-emitting device 1 may be configured to emit light emitted from the light-emitting layer 13 in an upward direction. Specifically, by using a reflective electrode as the anode electrode 11 and a light-transmissive electrode as the cathode electrode 15 respectively, the top-emitting type light-emitting device 1 can be achieved.

Modification Example 2

Figure 2:
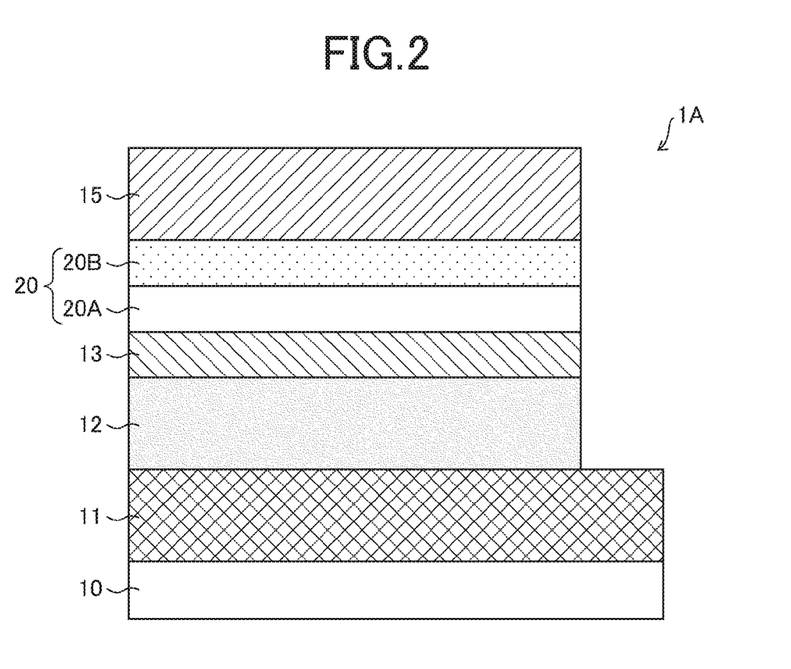
FIG. 2 is a diagram illustrating a schematic configuration of a light-emitting device as a modification example of the light-emitting device according to the first embodiment.

A light-emitting device 1A as a modification example of the light-emitting device 1 according to the first embodiment will be described. The light-emitting device 1A differs from the light-emitting device 1 in the configuration of the electron transport layer.

FIG. 2 is a diagram illustrating a schematic configuration of the light-emitting device 1A. As illustrated in FIG. 2, the light-emitting device 1A includes an electron transport layer 20 instead of the electron transport layer 14 according to the light-emitting device 1.

The electron transport layer 20 is configured by a lower layer 20A and an upper layer 20B. The lower layer 20A and the upper layer 20B both include metal oxides each of whose energy level of the lower end of the conduction band is less than or equal to the energy level of the lower end of the conduction band of the quantum dots included in the light-emitting layer 13. In the light-emitting device 1A according to the present embodiment, the lower layer 20A includes the above-described metal oxide that is amorphous, and the upper layer 20B includes the above-described metal oxide that is crystalline. The lower layer 20A is adjacent to the light-emitting layer 13.

According to the configuration described above, since the lower layer 20A of the electron transport layer 20 includes the amorphous metal oxide, there is no grain boundary. As a result, in the light-emitting device 1A, the interface between the lower layer 20A of the electron transport layer 20 and the light-emitting layer 13 is flat, and electrons can be efficiently injected into the light-emitting layer 13. Furthermore, since the upper layer 20B of the electron transport layer 20 includes the crystalline metal oxide, the carrier mobility of the electron transport layer 20 can be improved.

Note that the electron transport layer 20 may not be completely divided into two layers, and the amorphous and crystalline layers may be layered with a concentration gradient from the lower layer 20A to the upper layer 20B. In a case where the crystalline layer is layered on the amorphous layer, a film of a metal oxide is formed, and then preferably baked by irradiation using an excimer laser, a xenon lamp, or the like from the upper layer 20B side.

Second Embodiment

Other embodiments of the present invention may be described as follows. For convenience of description, members having the same function as the members stated in the embodiment above are designated by the same reference signs, and the description thereof is omitted.

Figure 3:
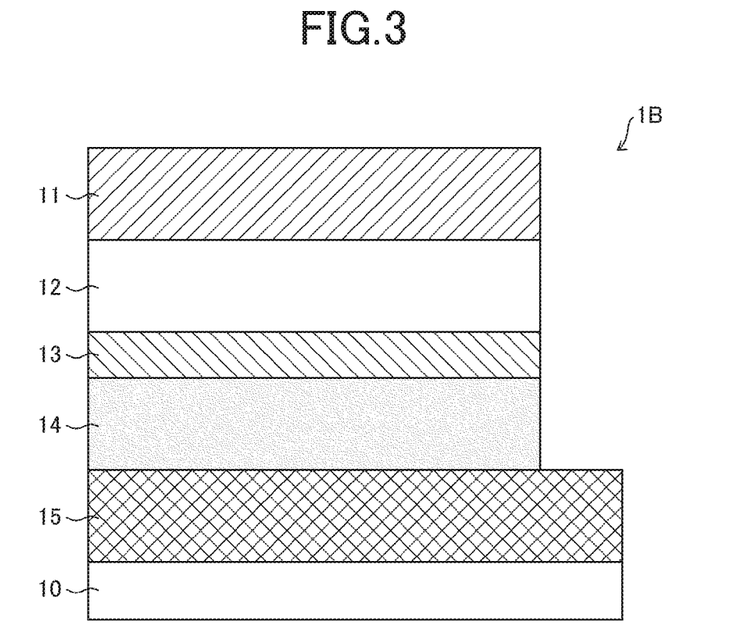
FIG. 3 is a diagram illustrating a schematic configuration of a light-emitting device according to a second embodiment.

In a light-emitting device 1B according to the present embodiment, the order in which the anode electrode 11, the hole transport layer 12, the light-emitting layer 13, the electron transport layer 14, and the cathode electrode 15 are formed is reversed from the light-emitting device 1 according to the first embodiment.

FIG. 3 is a diagram illustrating a schematic configuration of the light-emitting device 1B. As illustrated in FIG. 3, the light-emitting device 1B includes the substrate 10, the cathode electrode 15, the electron transport layer 14, the light-emitting layer 13, the hole transport layer 12, and the anode electrode 11 in this order from the bottom side of FIG. 3 toward the upward direction.

The metal oxide including In, Ga, and Zn included in the electron transport layer 14 according to the present embodiment is amorphous. Accordingly, the upper surface of the electron transport layer 14 can be made flat. As a result, when forming the light-emitting layer 13 on the upper surface of the electron transport layer 14, the light-emitting layer 13 can be made flat (in other words, surface roughness can be suppressed).

As a result, the light-emitting device 1B can emit light with high surface uniformity as compared to compared to a light-emitting device in which the electron transport layer includes a crystalline oxide semiconductor in which crystal grains are present. In a case where the metal oxide is amorphous, electrons can be efficiently injected into the light-emitting layer 13, a grain boundary is not present, and an interface between the electron transport layer 14 and the light-emitting layer 13 is flat. This allows electrons to be effectively injected into the light-emitting layer 13.

In the light-emitting device 1B of one aspect of the present invention, a film of the electron transport layer 14 may be formed for each unit of a plurality of pixels and may be formed in common for the plurality of pixels, provided that each of the red pixels (R pixels), green pixels (G pixels), and blue pixels (B pixels) can be individually caused to light up.

Modification Example 3

Figure 4:
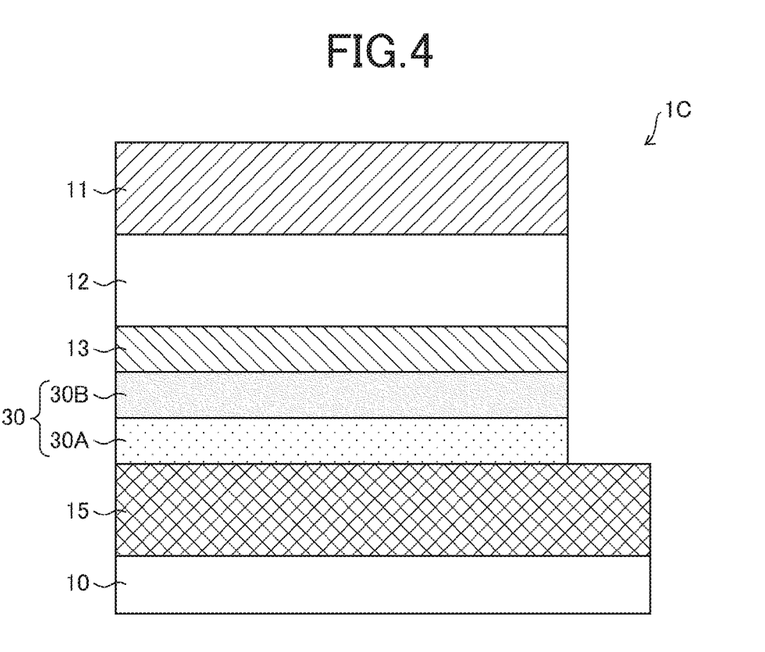
FIG. 4 is a diagram illustrating a schematic configuration of a light-emitting device as a modification example of the light-emitting device according to the second embodiment.

A light-emitting device 1C as a modification example of the light-emitting device 1B according to the second embodiment will be described. The light-emitting device 1C differs from the light-emitting device 1B in the configuration of the electron transport layer.

FIG. 4 is a diagram illustrating a schematic configuration of the light-emitting device 1C. As illustrated in FIG. 4, the light-emitting device 1C includes an electron transport layer 30 instead of the electron transport layer 14 according to the light-emitting device 1B.

The electron transport layer 30 is configured by a lower layer 30A and an upper layer 30B. The lower layer 30A and the upper layer 30B both include metal oxides each of whose energy level of the lower end of the conduction band is less than or equal to the energy level of the lower end of the conduction band of the quantum dots included in the light-emitting layer 13. In the light-emitting device 1C according to the present embodiment, the lower layer 30A includes the above-described metal oxide that is crystalline, and the upper layer 30B includes the above-described metal oxide that is amorphous. The upper layer 30B is adjacent to the light-emitting layer 13.

According to the configuration described above, since the upper layer 30B of the electron transport layer 30 includes the amorphous metal oxide, the upper surface of the electron transport layer 30 can be made flat. In this way, when forming the light-emitting layer 13 on the upper surface of the electron transport layer 30, the light-emitting layer 13 can be made flat. As a result, the light-emitting device 1C can emit light with high surface uniformity as compared to compared to a light-emitting device in which the electron transport layer includes a crystalline oxide semiconductor in which crystal grains are present. In a case where the metal oxide is amorphous, electrons can be efficiently injected into the light-emitting layer 13, a grain boundary is not present, and an interface between the electron transport layer 30B and the light-emitting layer 13 is flat. This allows electrons to be effectively injected into the light-emitting layer 13. Furthermore, since the lower layer 30A of the electron transport layer 30 includes the crystalline metal oxide, the carrier mobility of the electron transport layer 30 can be improved.

EXAMPLES

Hereinafter, examples of the light-emitting device of the present invention will be described.

Figure 5:
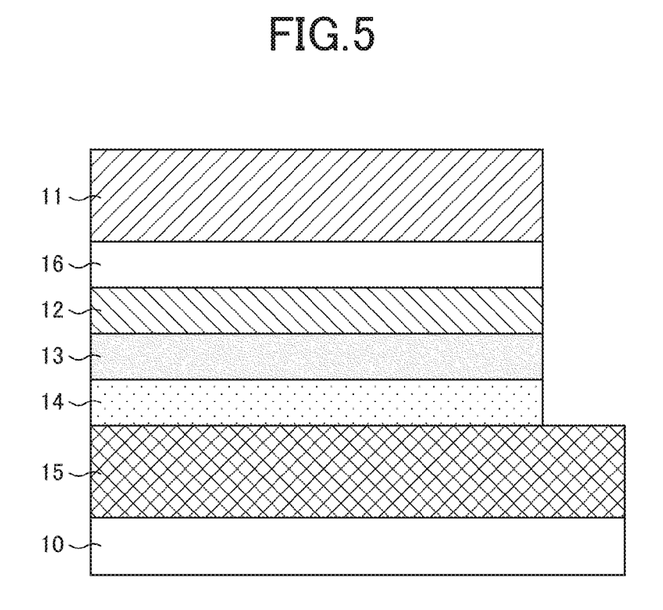
FIG. 5 is a diagram illustrating a schematic configuration of a light-emitting device according to an example.

FIG. 5 is a diagram illustrating a schematic configuration of light-emitting devices as Example 1, Example 2, and Comparative Example 1 used in the present examples. As illustrated in FIG. 5, the light-emitting devices according to the present examples includes the substrate 10, the cathode electrode 15, the electron transport layer 14, the light-emitting layer 13, the hole transport layer 12, a hole injection layer 16, and the anode electrode 11 in this order from the bottom side of FIG. 5 toward the upward direction.

The light-emitting devices of Example 1, Example 2, and Comparative Example 1 differ only in the configuration of the electron transport layer 14, and the same applies to other configurations.

The substrate 10 was configured by a glass substrate. The cathode 15 was an IZO film formed by sputtering and having a film thickness of 100 nm. The light-emitting layer 13 was formed to include quantum dots consisting of Cd (Se, S) and have a film thickness of 20 nm. The hole transport layer 12 was formed by vacuum vapor deposition of 4,4'-Bis(N-carbazolyl)-1,1'-biphenyl such that a film thickness thereof was 40 nm. The hole injection layer 16 was formed by vacuum vapor deposition of $MoO_3$ such that a film thickness thereof was 10 nm. The anode electrode 11 was formed by vacuum deposition of Al such that a film thickness thereof was 100 nm. After the film formation of each layer was completed, the resultant was sealed under nitrogen atmosphere.

The electron transport layer 14 according to the light-emitting device in Example 1 included a metal oxide including In, Ga, and Zn, and a film thereof was formed by sputtering through control of the oxygen concentration so that the carrier density of the metal oxide was $4.1\times10^{19}$ $cm^{-3}$. A film thickness of the electron transport layer 14 was 70 nm.

The electron transport layer 14 according to the light-emitting device in Example 2 included a metal oxide including In, Ga, and Zn, and a film thereof was formed by sputtering through control of the oxygen concentration so that the carrier density of the metal oxide was $6.3\times10^{19}$ $cm^{-3}$. A film thickness of the electron transport layer 14 was 70 nm.

A film of the electron transport layer 14 according to the light-emitting device in Comparative Example 1 was formed by sputtering ZnO. A film thickness of the electron transport layer 14 was 70 nm.

Figure 6:
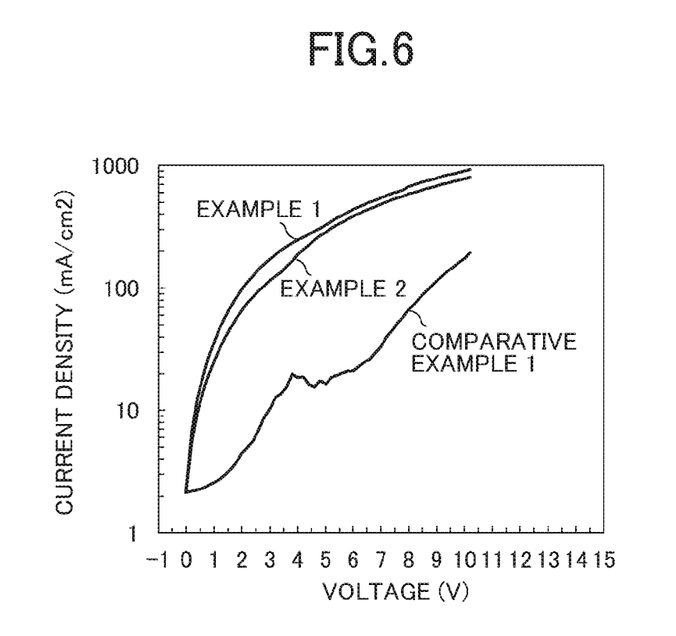
FIG. 6 is a measurement result of voltage-current density characteristics of the example.

The change in current density (voltage-current density characteristics) was measured when a voltage from 0 to 10 V was applied to the light-emitting devices as Example 1, Example 2, and Comparative Example 1. FIG. 6 is a measurement result of the voltage-current density characteristics.

As shown in FIG. 6, in the light-emitting device of Comparative Example 1, it was confirmed that there was a region where current decreases with respect to the increase in voltage, and there was a region where the current density change exhibited the negative differential resistance. On the other hand, in the light-emitting devices of Example 1 and Example 2, the current density monotonically increases with respect to the increase in voltage, and there was no region where the current density change exhibited negative differential resistance. In other words, in the light-emitting devices of Example 1 and Example 2, electrons were allowed to be efficiently injected from the electron transport layer 14 into the quantum dots in the light-emitting devices of Example 1 and Example 2, and the luminous efficiency was high.

Supplement

The light-emitting devices (1, 1A to 1C) according to Aspect 1 of the present invention includes, between the anode electrode (11) and the cathode electrode (15), the light-emitting layer (13), the hole transport layer (12) configured to transport positive holes supplied from the anode electrode to the light-emitting layer, and the electron transport layer (14) configured to transport electrons supplied from the cathode electrode to the light-emitting layer, wherein the light-emitting layer includes quantum dots configured to emit light as a result of combination of the positive holes and the electrons, the electron transport layer includes a metal oxide, and an energy level of a lower end of a conduction band of the metal oxide is less than or equal to an energy level of a lower end of a conduction band of the quantum dots.

According to the configuration described above, it is possible to reduce the influence of the triangular potential generated by hetero-bonding between the metal oxide and the quantum dots. As a result, electrons can be efficiently injected from the electron transport layer into the quantum dots. Thus, electrons can be injected from the electron transport layer into the quantum dots at a low voltage.

In a light-emitting device according to Aspect 2 of the present invention, according to the above-described Aspect 1, a difference between the energy level of the lower end of the conduction band of the metal oxide and the energy level of the lower end of the conduction band of the quantum dots is not less than 0 eV and less than 0.5 eV.

In a light-emitting device according to Aspect 3 of the present invention, according to the above-described aspect 1 or 2, the metal oxide includes In, Ga, and Zn.

In a light-emitting device according to Aspect 4 of the present invention, according to the above-described Aspect 3, a composition ratio of In, Ga, and Zn in the metal oxide is In:Ga:Zn=1:X:Y ($0.8 \leq X \leq 1.2$ and $0.4 \leq Y \leq 1.2$).

In a light-emitting device according to Aspect 5 of the present invention, according to any one of the above-described aspects 1 to 4, the metal oxide is amorphous.

In a light-emitting device according to Aspect 6 of the present invention, according to any one of the above-described aspects 1 to 4, the metal oxide is crystalline.

In a light-emitting device according to Aspect 7 of the present invention, according to any one of the above-described aspects 1 to 4, in the electron transport layer, a layer including an amorphous metal oxide and a layer including a crystalline metal oxide are layered, and the layer including the amorphous metal oxide is adjacent to the light-emitting layer.

In a light-emitting device according to Aspect 8 of the present invention, according to any one of the above-described aspects 1 to 7, a film thickness of the electron transport layer is 5 nm or greater and 200 nm or less.

In a light-emitting device according to Aspect 9 of the present invention, according to any one of the above-described Aspects 1 to 8, a carrier density of the metal oxide is not less than $1.0\times10^{17}$ $cm^{-3}$.

In a light-emitting device according to Aspect 10 of the present invention, according to any one of the above-described Aspects 1 to 9, the quantum dots are formed of at least one material selected from the group consisting of GaN, GaP, $Ga_2O_3$, $Ga_2S_3$, Ge, CdSe, CdS, CdTe, CdO, InP, InN, $In_2S_3$. InGaN, AlInN, AGaInN, and CuInGaSe.

Additional Items

The present invention is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in each of the embodiments.

REFERENCE SIGNS LIST 1, 1A to 1C Light-emitting device
11 Anode electrode
12 Hole transport layer
13 Light-emitting layer
14, 20, 30 Electron transport layer
15 Cathode electrode

The invention claimed is:

1. A light-emitting device comprising:
a light-emitting layer disposed between an anode electrode and a cathode electrode, the light-emitting layer including quantum dots; and
an electron transport layer disposed between the cathode electrode and the light-emitting layer, the electron transport layer including a metal oxide that includes In, Ga, and Zn, wherein:
the quantum dots are formed of at least one material selected from the group consisting of GaN, GaP, $Ga_2O_3$, $Ga_2S_3$, Ge, CdSe, CdS, CdTe, CdO, InP, InN, $In_2S_3$, InGaN, AlInN, AlGaInN, and CuInGaSe; and
a composition ratio of In, Ga, and Zn in the metal oxide is In:Ga:Zn=1:X:Y ($0.8 \leq X \leq 1.2$ and $0.4 \leq Y \leq 1.2$).

2. The light-emitting device according to claim 1, wherein the metal oxide is amorphous.

3. The light-emitting device according to claim 1, wherein the metal oxide is crystalline.

4. The light-emitting device according to claim 1, wherein:
the electron transport layer includes a layer including an amorphous metal oxide and a layer including a crystalline metal oxide that are layered; and
the layer including the amorphous metal oxide is adjacent to the light-emitting layer.

5. The light-emitting device according to claim 1, wherein a film thickness of the electron transport layer is 5 nm or greater and 200 nm or less.

6. The light-emitting device according to claim 1, wherein a carrier density of the metal oxide is not less than $1.0 \times 10^{17}$ $cm^{-3}$.

7. A light-emitting device comprising:
a light-emitting layer disposed between an anode electrode and a cathode electrode, the light-emitting layer including quantum dots, a film thickness of the light-emitting layer approximately 20 nm; and
an electron transport layer disposed between the cathode electrode and the light-emitting layer, the electron transport layer including a metal oxide that includes In, Ga, and Zn, wherein:
the electron transport includes a layer including an amorphous metal oxide and a layer including a crystalline metal oxide that are layered; and
the layer including the amorphous metal oxide is adjacent to the light-emitting layer.

8. The light-emitting device according to claim 7, wherein a composition ratio of In, Ga, and Zn in the metal oxide is In:Ga:Zn=1:X:Y ($0.8 \leq X \leq 1.2$ and $0.4 \leq Y \leq 1.2$).

9. The light-emitting device according to claim 7, wherein the quantum dots are formed of at least one material selected from the group consisting of GaN, GaP, $Ga_2O_3$, $Ga_2S_3$, Ge, CdSe, CdS, CdTe, CdO, InP, InN, $In_2S_3$, InGaN, AlInN, AlGaInN, and CuInGaSe.

10. The light-emitting device according to claim 8, wherein the metal oxide is amorphous.

11. A light-emitting device comprising:
a light-emitting layer disposed between an anode electrode and a cathode electrode, the light-emitting layer including quantum dots; and
an electron transport layer disposed between the cathode electrode and the light-emitting layer, the electron transport layer including a metal oxide that includes In, Ga, and Zn, wherein:
the electron transport layer includes a layer including an amorphous metal oxide and a layer including a crystalline metal oxide that are layered; and
the layer including the amorphous metal oxide is adjacent to the light-emitting layer.

12. The light-emitting device according to claim 11, wherein the quantum dots are formed of at least one material selected from the group consisting of GaN, GaP, $Ga_2O_3$, $Ga_2S_3$, Ge, CdSe, CdS, CdTe, CdO, InP, InN, $In_2S_3$, InGaN, AlInN, AlGaInN, and CuInGaSe.

13. The light-emitting device according to claim 11, wherein a composition ratio of In, Ga, and Zn in the metal oxide is In:Ga:Zn=1:X:Y ($0.8 \leq X \leq 1.2$ and $0.4 \leq Y \leq 1.2$).

14. The light-emitting device according to claim 11, wherein a film thickness of the electron transport layer is 5 nm or greater and 200 nm or less.

15. The light-emitting device according to claim 11, wherein a carrier density of the metal oxide is not less than $1.0 \times 10^{17}$ $cm^{-3}$.

* * * * *